United States Patent
Manabe et al.

(10) Patent No.: US 9,967,504 B1
(45) Date of Patent: May 8, 2018

(54) IMAGING SENSOR WITH BOOSTED PHOTODIODE DRIVE

(71) Applicant: OMNIVISION TECHNOLOGIES, INC., Santa Clara, CA (US)

(72) Inventors: Sohei Manabe, San Jose, CA (US); Keiji Mabuchi, Los Altos, CA (US); Takayuki Goto, Foster City, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days. days.

(21) Appl. No.: 15/480,833

(22) Filed: Apr. 6, 2017

(51) Int. Cl.
 *H04N 5/374* (2011.01)
 *H04N 5/378* (2011.01)
 *H01L 27/146* (2006.01)

(52) U.S. Cl.
 CPC ......... *H04N 5/378* (2013.01); *H01L 27/1463* (2013.01); *H01L 27/14605* (2013.01); *H01L 27/14643* (2013.01); *H04N 5/374* (2013.01)

(58) Field of Classification Search
 CPC .. H04N 5/378; H04N 5/374; H01L 27/14605; H01L 27/1463; H01L 27/14643
 See application file for complete search history.

(56) References Cited

U.S. PATENT DOCUMENTS

| | | | |
|---|---|---|---|
| 7,323,671 B1* | 1/2008 | Toros | H01L 27/14654 250/208.1 |
| 9,734,910 B1* | 8/2017 | Park | G11C 16/0408 |
| 2009/0141155 A1* | 6/2009 | Ellis-Monaghan | H04N 5/35527 348/308 |
| 2011/0101420 A1 | 5/2011 | Patel | |
| 2017/0085814 A1* | 3/2017 | Hynecek | H04N 5/3559 |
| 2017/0104487 A1* | 4/2017 | Gazit | H03K 19/01850 |

* cited by examiner

*Primary Examiner* — Hung Lam
(74) *Attorney, Agent, or Firm* — Christensen O'Connor Johnson Kindness PLLC (57) ABSTRACT

A pixel circuit for use in an image sensor includes an unpinned photodiode disposed in a semiconductor material. The unpinned photodiode adapted to photogenerate charge carriers in response to incident light. A floating diffusion is disposed in the semiconductor and coupled to receive the charge carriers photogenerated in the unpinned photodiode. A transfer transistor is disposed in the semiconductor material and coupled between the unpinned photodiode and the floating diffusion. The transfer transistor is adapted to be switched on to transfer the charge carriers photogenerated in the unpinned photodiode to the floating diffusion. A boost capacitor is disposed over a surface of the semiconductor material proximate to the unpinned photodiode. The boost capacitor is coupled to receive a photodiode boost signal while the transfer transistor is switched on to further drive the charge carriers photogenerated in the unpinned photodiode to the floating diffusion.

23 Claims, 6 Drawing Sheets

IMAGING SENSOR WITH BOOSTED PHOTODIODE DRIVE

BACKGROUND INFORMATION

Field of the Disclosure

The present invention relates generally to imaging systems, and more particularly to CMOS image sensors boosted photodiodes.

Background

Image sensors have become ubiquitous. They are widely used in digital cameras, cellular phones, security cameras, as well as, medical, automobile, and other applications. The technology used to manufacture image sensors, and in particular, complementary metal-oxide-semiconductor (CMOS) image sensors, has continued to advance at great pace. For example, the demands of higher resolution and lower power consumption have encouraged the further miniaturization and integration of these image sensors.

In conventional CMOS image sensors, the photodiodes of pixels are typically pinned photodiodes. Pinned photodiodes are commonly used for a variety of reasons including facilitating the transfer of image charge from the pinned photodiode to the floating diffusion. A typical pinned photodiode includes a shield layer, which may sometimes also be referred to as the "pinning" layer or the "cap" layer, at the silicon surface of the photodiode to prevent the silicon surface of the photodiode from being depleted. This shield layer of the pinned photodiode typically includes with a very thin layer with a large boron density (e.g., p+ doped layer). The boron is implanted with low energy, but the boron implant nevertheless causes implant damage at the silicon surface of the pinned photodiode due to the high density of the p+ shield layer. This implant damage in the shield layer of the pinned photodiode may cause unwanted white pixels and dark current in the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise. It should be noted that element names and symbols may be used interchangeably through this document (e.g., Si vs. silicon); however, both have identical meaning.

As will be shown, an example of a pixel circuit for use in an imaging sensor is implemented with an unpinned photodiode, which therefore eliminates the need for the highly doped thin shield layer at the silicon surface of the photodiode. As such, the damage caused by the implant of boron at the silicon surface of the photodiode is eliminated. In the examples, a boost capacitor is coupled to the unpinned photodiode in accordance with the teachings of the present invention. In one example, a photodiode boost signal with a negative voltage having an increased magnitude is applied to the boost capacitor, which accumulates accumulate holes in the unpinned photodiode proximate to the silicon surface and therefore prevents the unpinned photodiode from being depleted near the silicon surface proximate to the silicon surface, and therefore helps to drive image charge from the unpinned photodiode to the floating diffusion in accordance with the teachings of the present invention. In one example, an isolation region proximate to the unpinned photodiode is also coupled to receive a boost signal with an increased magnitude while the photodiode receives the photodiode boost signal with increased magnitude, which further drives image charge from the unpinned photodiode to the floating diffusion in accordance with the teachings of the present invention.

Figure 1:
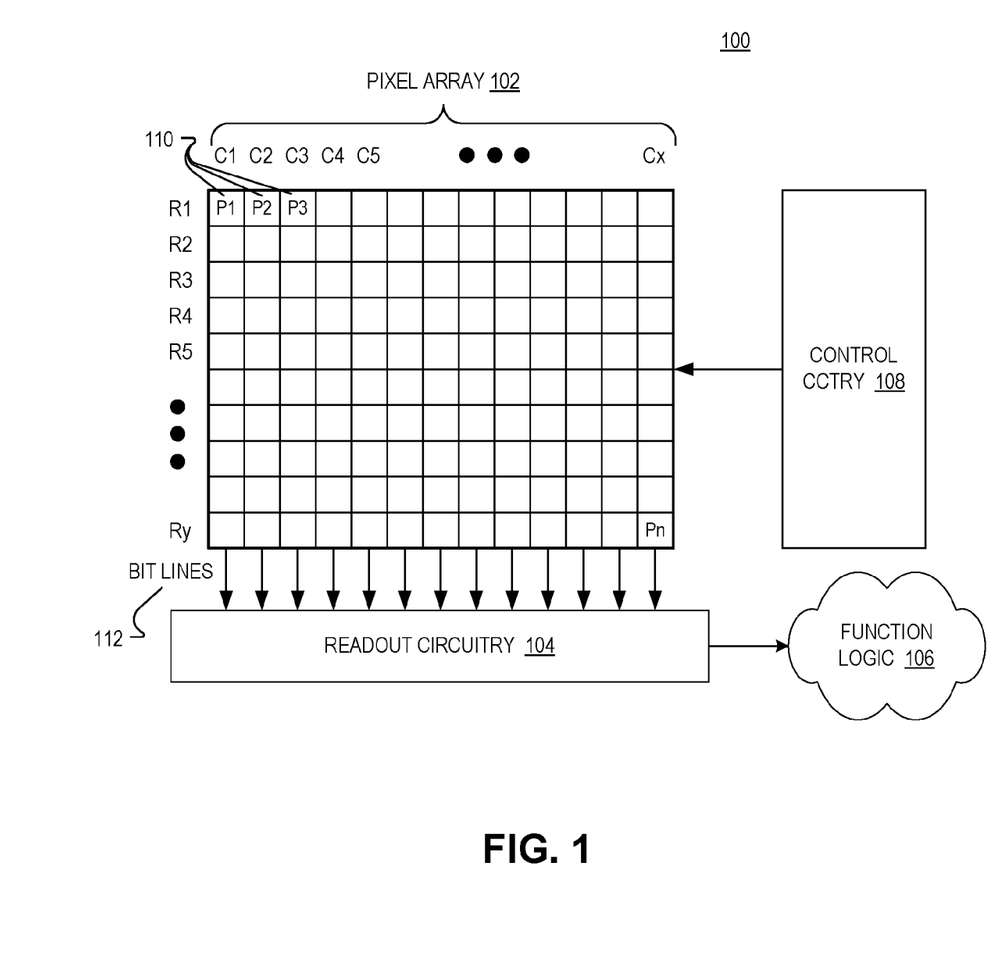
FIG. 1 is a diagram illustrating one example of imaging system including a pixel array in which each pixel circuit includes an unpinned photodiode with boosted photodiode drive in accordance with the teachings of the present invention.

To illustrate, FIG. 1 is a diagram illustrating one example of an imaging system 100 including a pixel array 102 in which each pixel circuit 110 includes an unpinned photodiode with boosted photodiode drive in accordance with the teachings of the present invention. As shown in the depicted example, imaging system 100 includes pixel array 102 coupled to control circuitry 108 and readout circuitry 104, which is coupled to function logic 106.

In one example, pixel array 102 is a two-dimensional (2D) array of image sensor pixel circuits 110 (e.g., P1, P2, P3, . . . , Pn). As illustrated, each pixel circuit 110 is arranged into a row (e.g., rows R1 to Ry) and a column (e.g., column C1 to Cx) to acquire image data of a person, place, object, etc., which can then be used to render a 2D image of the person, place, object, etc.

In one example, after each pixel circuit 110 (e.g., P1, P2, P3, . . . , Pn) has acquired its image data or image charge in a respective unpinned photodiode included in the pixel circuit, the image data is transferred from the unpinned photodiode to a floating diffusion, and is then readout by readout circuitry 104 through bitlines 130, and then transferred to function logic 106. In various examples, while the image charge is transferred from the unpinned photodiode to the floating diffusion, the unpinned photodiode drive is boosted with a photodiode boost signal in accordance with the teachings of the present invention. In addition, in various embodiments, an isolation boost signal is also applied while the photodiode boost signal is applied while the image charge is transferred from the unpinned photodiode to the floating diffusion to boost the unpinned photodiode drive in accordance with the teachings of the present invention.

In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column lines (illustrated) or may readout the image data using a variety of other techniques (not illustrated), such as a serial readout or a full parallel readout of all pixels simultaneously.

In one example, control circuitry 108 is coupled to pixel array 102 to control operational characteristics of pixel circuits 110 of pixel array 102. In one example, control circuitry 108 may be coupled to generate a global shutter signal for controlling image acquisition for each pixel circuit 110. In the example, the global shutter signal simultaneously enables all pixel circuits 110 (e.g., P1, P2, P3, . . . Pn) within pixel array 102 to simultaneously enable all of the pixel circuits 110 in pixel array 102 to simultaneously transfer the image charge from each respective photodetector during a single acquisition window.

Figure 2:
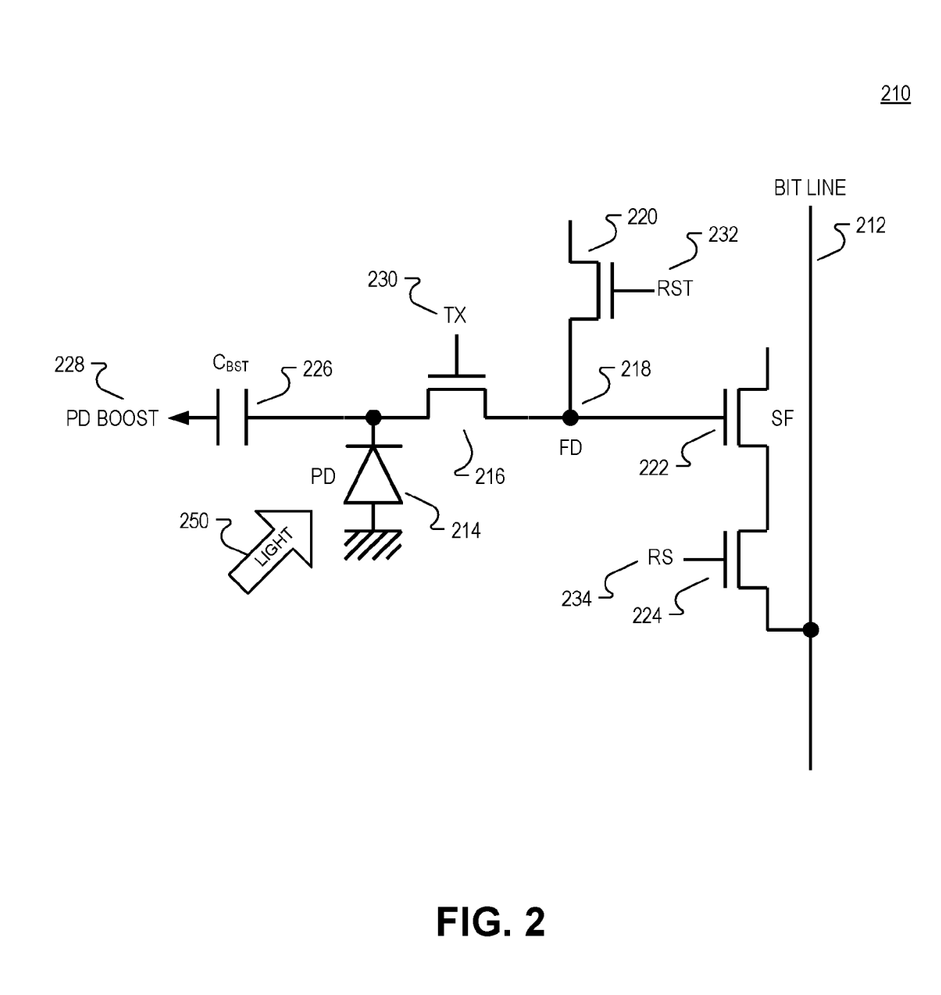
FIG. 2 is a diagram illustrating one example of a pixel circuit with an unpinned photodiode with boosted photodiode drive in accordance with the teachings of the present invention.

FIG. 2 is a diagram illustrating one example of a pixel circuit 210 with an unpinned photodiode 214 with boosted photodiode drive in accordance with the teachings of the present invention. It is noted that pixel circuit 210 may be an example of one of the pixel circuits 110 of pixel array 102 of FIG. 1, and that similarly named and numbered elements referenced below are coupled and function similar to as described above. As shown in the example depicted in FIG. 2, pixel circuit 210 includes an unpinned photodiode PD 214 adapted to photogenerate charge carriers in response to incident light 250 during an exposure of an image capture of an image sensor including pixel circuit 210. A floating diffusion FD 218 is coupled to receive the charge carriers photogenerated in the unpinned photodiode PD 214 in response to incident light 250. A transfer transistor 216 is coupled between the unpinned photodiode PD 214 and the floating diffusion FD 218. In operation, the transfer transistor 216 is adapted to be switched in response to a transfer signal TX to transfer the charge carriers photogenerated in the unpinned photodiode PD 214 to the floating diffusion FD 218.

A boost capacitor $C_{BST}$ 226 is coupled to the unpinned photodiode PD 214. In operation, the boost capacitor $C_{BST}$ 226 is coupled to receive a photodiode boost signal PD BOOST 228 while the transfer transistor 216 is switched on to further drive the charge carriers photogenerated in the unpinned photodiode PD 214 in response to light 250 to the floating diffusion FD 218 in accordance with the teachings of the present invention.

Continuing with the depicted example, an amplifier transistor 222 includes a gate terminal coupled to the floating diffusion FD 218 to generate an output signal of the pixel circuit 210. In the example, amplifier transistor 222 is a source follower (SF) coupled transistor having a drain terminal coupled to a voltage source and a source terminal coupled to generate the output signal of the pixel circuit. A row select transistor 224 is coupled to the amplifier transistor 222 to selectively couple the output signal of the pixel circuit in response to row select signal RS to an output bitline 212 of the pixel circuit 210. A reset transistor 220 is coupled to selectively reset the floating diffusion FD 218 in response to a reset signal RST. In one example, the reset transistor includes a drain terminal coupled to a reset voltage, and a source terminal coupled to the floating diffusion FD 218. In one example, the unpinned photodiode 214 PD 214 may also be reset through reset transistor 220 with the transfer transistor 216 turned on.

Figure 3:
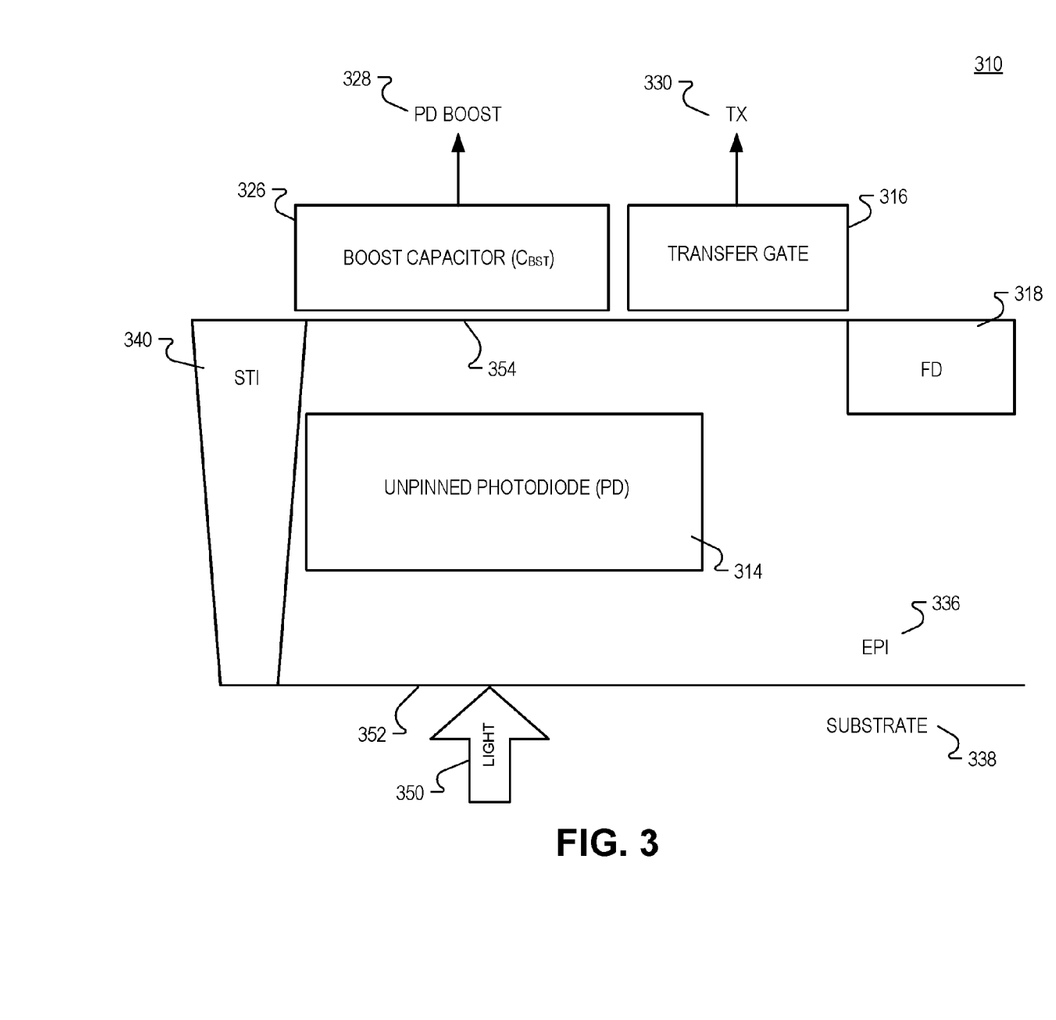
FIG. 3 is a cross-section illustration of a portion of an example pixel circuit with an unpinned photodiode with boosted photodiode drive in accordance with the teachings of the present invention.

FIG. 3 is a cross-section illustration of a portion of an example pixel circuit 310 with an unpinned photodiode with boosted photodiode drive in accordance with the teachings of the present invention. It is noted that pixel circuit 310 may be an example of one of the pixel circuits 110 of pixel array 102 of FIG. 1, or pixel circuit 210 of FIG. 2, and that similarly named and numbered elements referenced below are coupled and function similar to as described above. As shown in the example depicted in FIG. 3, pixel circuit 310 includes an unpinned photodiode PD 314 disposed in a semiconductor material 336. In one example, semiconductor material 336 includes an n-doped or p-doped epitaxial (EPI) layer of silicon. In operation, the unpinned photodiode PD is adapted to photogenerate charge carriers in response to incident light 350 during an exposure of an image capture of an image sensor including pixel circuit 310. In the depicted example, it is noted that incident light 350 is directed through a backside surface 352 of semiconductor material 336. In one example, semiconductor material 336 is disposed proximate to a silicon substrate 338. A floating diffusion FD 318 is disposed in the semiconductor material 336 and is coupled to receive the charge carriers that were photogenerated in the unpinned photodiode PD 314 in response to incident light 350. A transfer transistor (which is illustrated in FIG. 3 with transfer gate 316) is disposed in the semiconductor material 336 and coupled between the unpinned photodiode PD 314 and the floating diffusion FD 318. As shown in the depicted example, the transfer gate 316 of the transfer transistor is coupled to be switched on in response to a transfer signal TX 330 to transfer the charge carriers photogenerated in the unpinned photodiode PD 314 to the floating diffusion FD 318.

As shown in the depicted example, pixel circuit 310 also includes a boost capacitor $C_{BST}$ 326 disposed over a surface 354 of the semiconductor material 336 proximate to the unpinned photodiode PD 314. In the example, the surface 354 is a front side surface of semiconductor material 336. In operation, the boost capacitor $C_{BST}$ 326 is coupled to receive a photodiode boost signal PD boost 328 while the transfer transistor 316 is switched on to further drive the charge carriers photogenerated in the unpinned photodiode PD 314 to the floating diffusion FD 318 in accordance with the teachings of the present invention. In one example, an isolation region 340 is disposed in the semiconductor material 336 proximate to the unpinned photodiode PD 314 and opposite the transfer transistor 316 such that the unpinned photodiode PD 314 is disposed in the semiconductor material 336 between the isolation region 340 and the transfer transistor 316. In one example, the isolation region 340 includes a shallow trench isolation (STI) structure.

Figure 4:
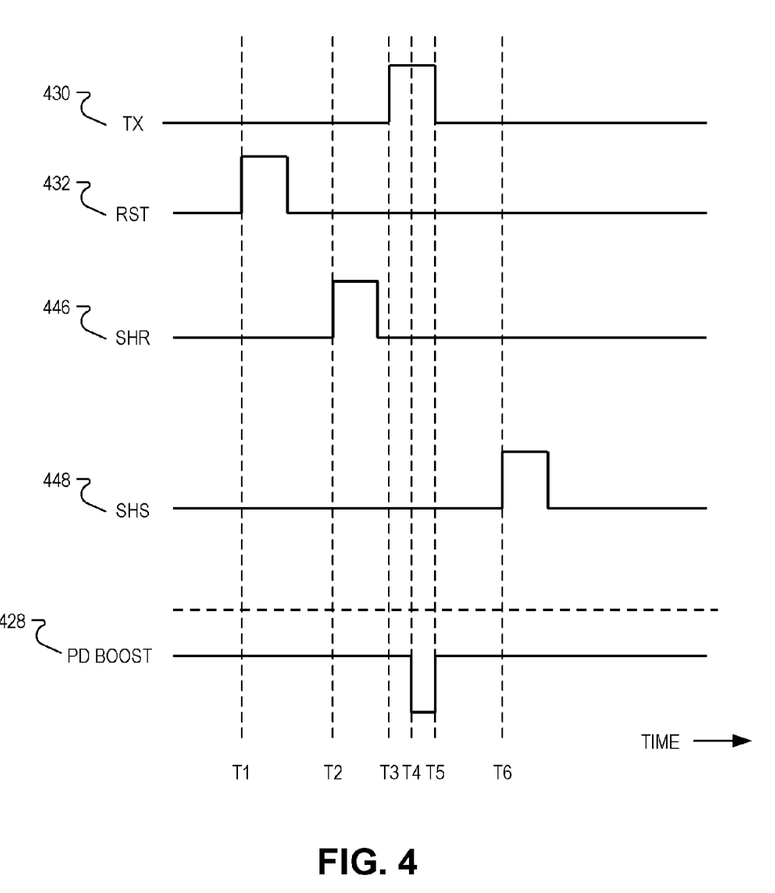
FIG. 4 is a timing diagram illustrating one example of signals of an example pixel circuit with an unpinned photodiode with boosted photodiode drive in accordance with the teachings of the present invention.

FIG. 4 is a timing diagram illustrating one example of signals of an example pixel circuit with an unpinned photodiode with boosted photodiode drive in accordance with the teachings of the present invention. It is noted that example signals described in FIG. 4 may be applied to one of the pixel circuits 110 of pixel array 102 of FIG. 1, pixel circuit 210 of FIG. 2, or pixel circuit 310 of FIG. 3, and that similarly named and numbered elements referenced below are coupled and function similar to as described above. As shown in the example depicted in FIG. 4, at time T1, the reset RST 432 signal is pulsed, which turns on the reset transistor 232 to reset the charge in the floating diffusion FD 218/318. At time T2, a sample and hold after the reset (SHR) 446 of the floating diffusion may be performed to obtain a first value for a correlated double sampling (CDS) operation of the pixel cell. After the sample and hold of the reset value in the floating diffusion FD 218/318 is obtained, the transfer signal TX 430 is turned on at time T3 to turn on the transfer transistor 216/316 to begin the transfer of image charge photogenerated in the unpinned photodiode PD 214/314 to the floating diffusion FD 218/318.

While the transfer signal TX 430 is turned on, the photodiode boost signal PD BOOST 428 transitions from a negative voltage to a higher magnitude negative voltage at time T4 as shown. In so doing, the higher magnitude voltage at time T4 is applied to the boost capacitor $C_{BST}$ 226/326, which attracts and drives the image charge electrons photogenerated in the unpinned photodiode PD 214/314 to the floating diffusion FD 218/318 in accordance with the teachings of the present invention Continuing with the depicted example, after the image charge electrons photogenerated in the unpinned photodiode PD 214/314 are transferred to the floating diffusion FD 218/318, the transfer signal TX 430 is turned off, and the photodiode boost signal PD BOOST 428 transitions back to the previous lower magnitude negative voltage at time T5. At time T6, a sample and hold of the signal (SHS) 448 of the floating diffusion may be performed to obtain a second value for a correlated double sampling (CDS) operation of the pixel cell to readout the pixel data from the pixel cell in accordance with the teachings of the present invention.

Figure 5:
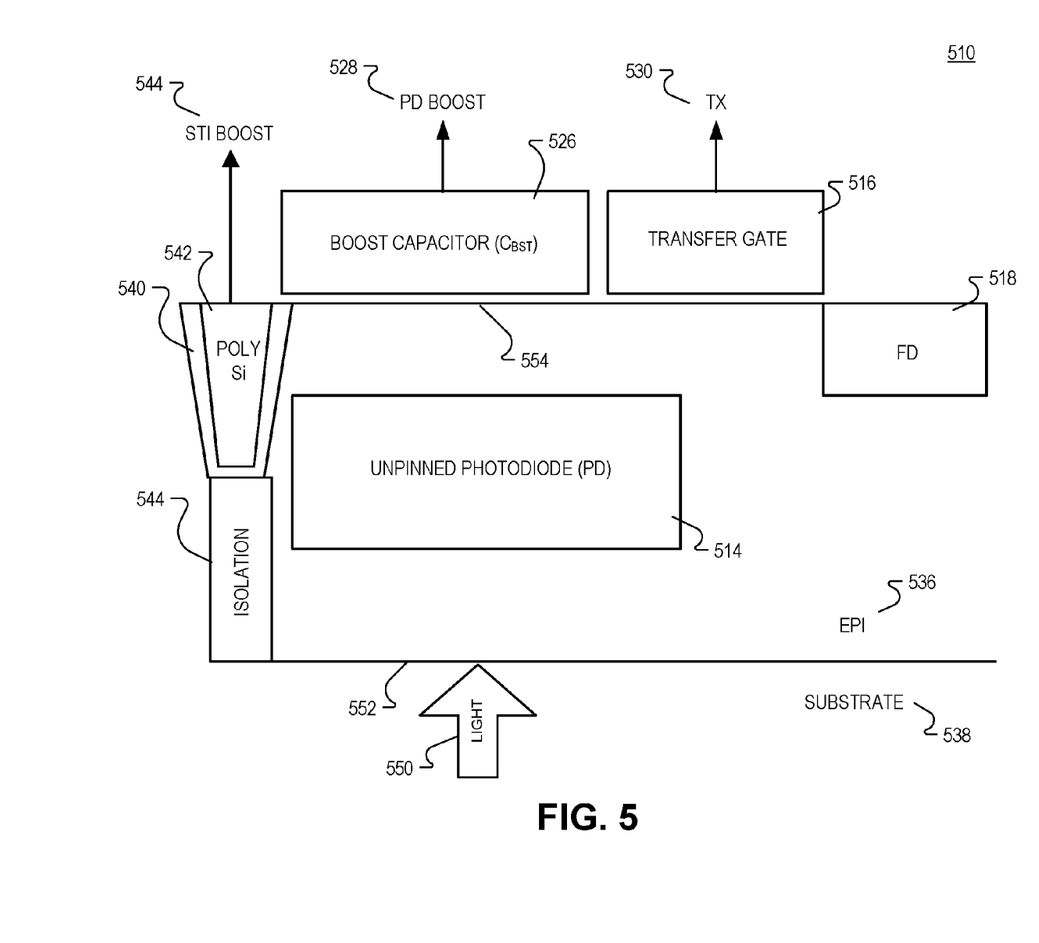
FIG. 5 is a cross-section illustration of a portion of another example pixel circuit with an unpinned photodiode with boosted photodiode drive in accordance with the teachings of the present invention.

FIG. 5 is a cross-section illustration of a portion of another example pixel circuit 510 with an unpinned photodiode with boosted photodiode drive in accordance with the teachings of the present invention. It is noted that pixel circuit 510 may be another example of one of the pixel circuits 110 of pixel array 102 of FIG. 1, or pixel circuit 210 of FIG. 2, and that similarly named and numbered elements referenced below are coupled and function similar to as described above. It is also appreciated that pixel circuit 510 shares many similarities with pixel circuit 310 of FIG. 3.

For instance, as shown in the example depicted in FIG. 5, pixel circuit 510 includes an unpinned photodiode PD 514 disposed in a semiconductor material 536. In one example, semiconductor material 536 includes an n-doped or p-doped epitaxial (EPI) layer of silicon. In operation, the unpinned photodiode PD is adapted to photogenerate charge carriers in response to incident light 550 during an exposure of an image capture of an image sensor including pixel circuit 510. In the depicted example, it is noted that incident light 550 is directed through a backside surface 552 of semiconductor material 536. In one example, semiconductor material 536 is disposed proximate to a silicon substrate 538. A floating diffusion FD 518 is disposed in the semiconductor material 536 and is coupled to receive the charge carriers that were photogenerated in the unpinned photodiode PD 514 in response to incident light 550. A transfer transistor (which is illustrated in FIG. 5 with transfer gate 516) is disposed in the semiconductor material 536 and coupled between the unpinned photodiode PD 514 and the floating diffusion FD 518. As shown in the depicted example, the transfer gate 516 of the transfer transistor is coupled to be switched on in response to a transfer signal TX 530 to transfer the charge carriers photogenerated in the unpinned photodiode PD 514 to the floating diffusion FD 318.

As shown in the depicted example, pixel circuit 510 also includes a boost capacitor $C_{BST}$ 526 disposed over a surface 554 of the semiconductor material 536 proximate to the unpinned photodiode PD 514. In the example, the surface 554 is a front side surface of semiconductor material 536. In operation, the boost capacitor $C_{BST}$ 526 is coupled to receive a photodiode boost signal PD boost 528 while the transfer transistor 516 is switched on to further drive the charge carriers photogenerated in the unpinned photodiode PD 514 to the floating diffusion FD 518 in accordance with the teachings of the present invention. In one example, an isolation region 540 is disposed in the semiconductor material 536 proximate to the unpinned photodiode PD 514 and opposite the transfer transistor 516 such that the unpinned photodiode PD 514 is disposed in the semiconductor material 536 between the isolation region 540 and the transfer transistor 516. In the depicted example, the isolation region 540 includes a shallow trench isolation (STI) structure.

As also shown in the depicted example, the STI structure of isolation region 540 also includes a polysilicon region 542 disposed entirely within the isolation region 540. The polysilicon region 542 is coupled to receive an isolation boost signal 544 while the transfer transistor 516 is switched on and while the boost capacitor $C_{BST}$ 526 is coupled to receive a photodiode boost signal STI BOOST 544 to further drive the charge carriers photogenerated in the unpinned photodiode PD 514 to the floating diffusion FD 518 in accordance with the teachings of the present invention. Indeed, as will be discussed in further detail below, the polysilicon region 542 within the isolation region 540 isolates the boost capacitor $C_{BST}$ 526 from ground by apply a positive pulse in the short term. In so doing, the boost capacitor $C_{BST}$ 526 can boost the unpinned photodiode PD 514 more effectively in accordance with the teachings of the present invention. In the depicted example, a buried isolation region 544 is also included in the semiconductor material 536 beneath isolation region 540 as shown to provide further isolation of pixel cell 510 in accordance with the teachings of the present invention.

Figure 6:
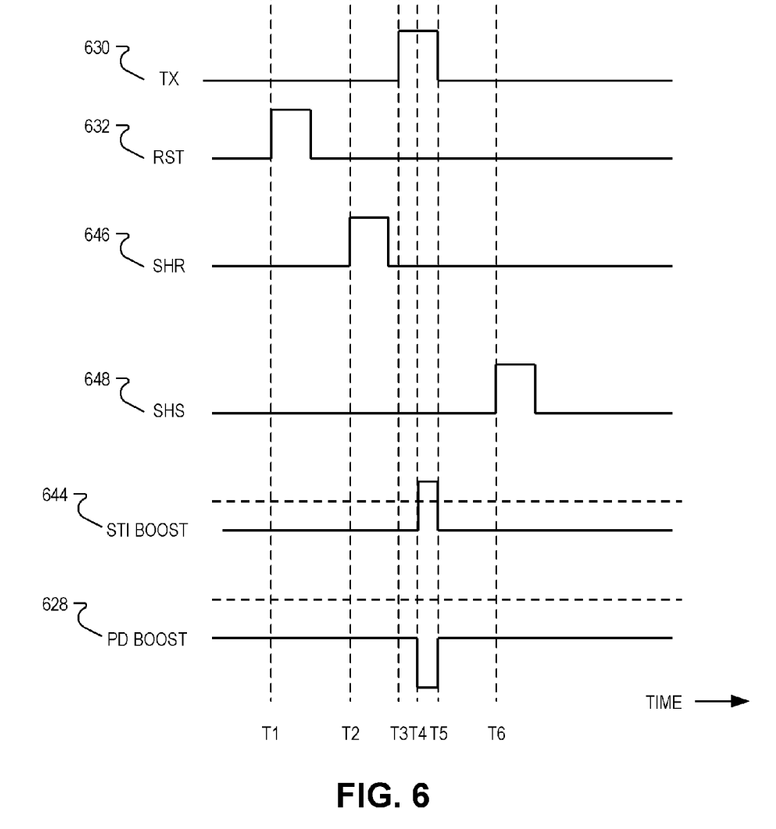
FIG. 6 is a timing diagram illustrating one example of the signals of another example of a pixel circuit with an unpinned photodiode with boosted photodiode drive in accordance with the teachings of the present invention.

FIG. 6 is a timing diagram illustrating one example of the signals of another example of a pixel circuit with an unpinned photodiode with boosted photodiode drive in accordance with the teachings of the present invention. It is noted that example signals described in FIG. 6 may be applied to one of the pixel circuits 110 of pixel array 102 of FIG. 1, pixel circuit 210 of FIG. 2, or pixel circuit 510 of FIG. 5, and that similarly named and numbered elements referenced below are coupled and function similar to as described above. As shown in the example depicted in FIG. 6, at time T1, the reset RST 632 signal is pulsed, which turns on the reset transistor 232 to reset the charge in the floating diffusion FD 218/518. At time T2, a sample and hold after the reset (SHR) 646 of the floating diffusion may be performed to obtain a first value for a correlated double sampling (CDS) operation of the pixel cell. After the sample and hold of the reset value in the floating diffusion FD 218/518 is obtained, the transfer signal TX 630 is turned on at time T3 to turn on the transfer transistor 216/516 to begin the transfer of image charge photogenerated in the unpinned photodiode PD 214/514 to the floating diffusion FD 218/518.

While the transfer signal TX 630 is turned on, at time T4, the photodiode boost signal PD BOOST 628 transitions from a negative voltage to a higher magnitude negative voltage as shown. In addition, at time T4, an isolation boost signal STI BOOST 644 transitions from a negative voltage to a positive voltage as shown while the transfer signal TX 630 is turned on, and while the boost capacitor $C_{BST}$ 226/526 is coupled to receive a photodiode boost signal PD BOOST 628 having the increased magnitude negative voltage to further drive the charge carriers photogenerated in the unpinned photodiode PD 214/514 to the floating diffusion FD 218/518. In so doing, the higher magnitude voltage at time T4 is applied to the boost capacitor $C_{BST}$ 226/326, in combination with the positive pulse applied to the polysilicon region 542 with isolation boost signal STI BOOST 644 further attract and drive the image charge electrons photogenerated in the unpinned photodiode PD 214/514 to the floating diffusion FD 218/518 in accordance with the teachings of the present invention. As mentioned above, the polysilicon region 542 within the isolation region 540 isolates the boost capacitor $C_{BST}$ 526 from ground by with the application of the positive pulse of isolation boost signal STI BOOST 644 in the short term. In so doing, the boost capacitor $C_{BST}$ 526 can boost the unpinned photodiode PD 514 more effectively with the negative pulse of photodiode boost signal PD BOOST 628 at time T4 in accordance with the teachings of the present invention.

Continuing with the depicted example, after the image charge electrons photogenerated in the unpinned photodiode PD 214/514 are transferred to the floating diffusion FD 218/518, the transfer signal TX 630 is turned off, the photodiode boost signal PD BOOST 628 transitions back to the previous lower magnitude negative voltage, and the isolation boost signal STI BOOST 644 transitions back to the negative voltage at time T5. At time T6, a sample and hold of the signal (SHS) 448 of the floating diffusion may be performed to obtain a second value for a correlated double sampling (CDS) operation of the pixel cell to readout the pixel data from the pixel cell in accordance with the teachings of the present invention.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A pixel circuit for use in an image sensor, comprising:
   an unpinned photodiode disposed in a semiconductor material, the unpinned photodiode adapted to photogenerate charge carriers in response to incident light during a single exposure of a single image capture of the image sensor;
   a floating diffusion disposed in the semiconductor and coupled to receive the charge carriers photogenerated in the unpinned photodiode;
   a transfer transistor disposed in the semiconductor material and coupled between the unpinned photodiode and the floating diffusion, wherein the transfer transistor is adapted to be switched on to transfer the charge carriers photogenerated in the unpinned photodiode to the floating diffusion; and
   a boost capacitor disposed over a surface of the semiconductor material proximate to the unpinned photodiode, wherein the boost capacitor is coupled to receive a photodiode boost signal while the transfer transistor is switched on to further drive the charge carriers photogenerated in the unpinned photodiode to the floating diffusion.

2. The pixel circuit of claim 1, further comprising an isolation region disposed in the semiconductor material proximate to the unpinned photodiode and opposite the transfer transistor such that the unpinned photodiode is disposed in the semiconductor material between the isolation region and the transfer transistor.

3. The pixel circuit of claim 2, wherein the isolation region comprises a shallow trench isolation region disposed in the semiconductor material.

4. The pixel circuit of claim 2, further comprising a polysilicon region disposed entirely within the isolation region, wherein the polysilicon region is coupled to receive an isolation boost signal while the transfer transistor is switched on and while the boost capacitor is coupled to receive a photodiode boost signal to further drive the charge carriers photogenerated in the unpinned photodiode to the floating diffusion.

5. The pixel circuit of claim 1, wherein the semiconductor material in which the unpinned photodiode disposed comprises a doped epitaxial layer.

6. The pixel circuit of claim 5, wherein the doped epitaxial layer comprises p-doped or n-doped silicon.

7. The pixel circuit of claim 5, further comprising a semiconductor substrate disposed proximate to the doped epitaxial layer.

8. The pixel circuit of claim 1, wherein the incident light is directed through a backside surface of the semiconductor material.

9. The pixel circuit of claim 1, further comprising an amplifier transistor disposed in the semiconductor material, wherein the amplifier transistor has a gate terminal coupled to the floating diffusion to generate an output signal of the pixel circuit.

10. The pixel circuit of claim 9, further comprising a row select transistor disposed in the semiconductor material and coupled to the amplifier transistor to selectively couple the output signal of the pixel circuit to an output bitline.

11. The pixel circuit of claim 1, further comprising a reset transistor disposed in the semiconductor material, wherein the reset transistor is coupled to selectively reset the floating diffusion in response to a reset signal.

12. An imaging sensor system, comprising:
a pixel array of pixel circuits, wherein each one of the pixel circuits includes:
an unpinned photodiode disposed in a semiconductor material, the unpinned photodiode adapted to photogenerate charge carriers in response to incident light during a single exposure of a single image capture of the image sensor;
a floating diffusion disposed in the semiconductor and coupled to receive the charge carriers photogenerated in the unpinned photodiode;
a transfer transistor disposed in the semiconductor material and coupled between the unpinned photodiode and the floating diffusion, wherein the transfer transistor is adapted to be switched on to transfer the charge carriers photogenerated in the unpinned photodiode to the floating diffusion; and
a boost capacitor disposed over a surface of the semiconductor material proximate to the unpinned photodiode, wherein the boost capacitor is coupled to receive a photodiode boost signal while the transfer transistor is switched on to further drive the charge carriers photogenerated in the unpinned photodiode to the floating diffusion;
control circuitry coupled to the pixel array to control operation of the pixel array; and
readout circuitry coupled to the pixel array to readout image data from the plurality of pixels.

13. The imaging sensor system of claim 12, further comprising function logic coupled to the readout circuitry to store the image data from each one of the pixel circuits.

14. The imaging sensor system of claim 12, wherein each one of the pixel circuits further includes an isolation region disposed in the semiconductor material proximate to the unpinned photodiode and opposite the transfer transistor such that the unpinned photodiode is disposed in the semiconductor material between the isolation region and the transfer transistor.

15. The imaging sensor system of claim 14, wherein the isolation region comprises a shallow trench isolation region disposed in the semiconductor material.

16. The imaging sensor system of claim 14, wherein each one of the pixel circuits further includes a polysilicon region disposed entirely within the isolation region, wherein the polysilicon region is coupled to receive an isolation boost signal while the transfer transistor is switched on and while the boost capacitor is coupled to receive a photodiode boost signal to further drive the charge carriers photogenerated in the unpinned photodiode to the floating diffusion.

17. The imaging sensor system of claim 12, wherein the semiconductor material in which the unpinned photodiode disposed comprises a doped epitaxial layer.

18. The imaging sensor system of claim 17, wherein the doped epitaxial layer comprises p-doped or n-doped silicon.

19. The imaging sensor system of claim 17, wherein each one of the pixel circuits further includes a semiconductor substrate disposed proximate to the doped epitaxial layer.

20. The imaging sensor system of claim 12, wherein the incident light is directed through a backside surface of the semiconductor material.

21. The imaging sensor system of claim 12, wherein each one of the pixel circuits further includes an amplifier transistor disposed in the semiconductor material, wherein the amplifier transistor has a gate terminal coupled to the floating diffusion to generate an output signal of the pixel circuit.

22. The imaging sensor system of claim 12, wherein each one of the pixel circuits further includes a row select transistor disposed in the semiconductor material and coupled to the amplifier transistor to selectively couple the output signal of the pixel circuit to an output bitline.

23. The imaging sensor system of claim 12, wherein each one of the pixel circuits further includes a reset transistor disposed in the semiconductor material, wherein the reset transistor is coupled to selectively reset the floating diffusion in response to a reset signal.

* * * * *